United States Patent
Wang et al.

(10) Patent No.: US 11,808,793 B2
(45) Date of Patent: Nov. 7, 2023

(54) DETECTION DEVICE, INVERTER AND DETECTION METHOD

(71) Applicant: Delta Electronics (Shanghai) Co.,Ltd., Shanghai (CN)

(72) Inventors: Yu-Xi Wang, Shanghai (CN); Jun-Xiong Wu, Shanghai (CN); Bing-Wen Weng, Shanghai (CN); Xuan-Cai Zhu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/663,016

(22) Filed: May 11, 2022

(65) Prior Publication Data
US 2023/0020049 A1    Jan. 19, 2023

(30) Foreign Application Priority Data
Jul. 16, 2021   (CN) .......................... 202110805448.0

(51) Int. Cl.
*G01R 19/165*   (2006.01)
*G01R 15/18*    (2006.01)

(52) U.S. Cl.
CPC ..... *G01R 19/16571* (2013.01); *G01R 15/183* (2013.01)

(58) Field of Classification Search
None
See application file for complete search history.

(56) References Cited

U.S. PATENT DOCUMENTS

2019/0331725 A1* 10/2019 Ikushima ......... G01R 19/16538
2021/0166869 A1*  6/2021 Aljadeff ............ G01R 19/0007

FOREIGN PATENT DOCUMENTS

| CN | 204044236 U | 12/2014 |
| CN | 204422634 U |  6/2015 |
| CN | 207067224 U |  3/2018 |
| CN | 208421051 U |  1/2019 |

* cited by examiner

*Primary Examiner* — Douglas X Rodriguez
(74) *Attorney, Agent, or Firm* — CKC & Partners Co., LLC

(57) ABSTRACT

A detection device, an inverter, and a detection method are disclosed. The detection device is configured to detect a leakage current flowing through a conductor. The detection device includes a magnetic core, a detection winding and a calibration winding both wound on the magnetic core, a detection circuit, and a calibration circuit. The detection circuit is coupled to the detection winding, and configured to sample a detection signal of the detection winding to obtain a leakage current detection value. The calibration circuit is coupled to the calibration winding, and configured to provide a calibration signal to the calibration winding.

11 Claims, 9 Drawing Sheets

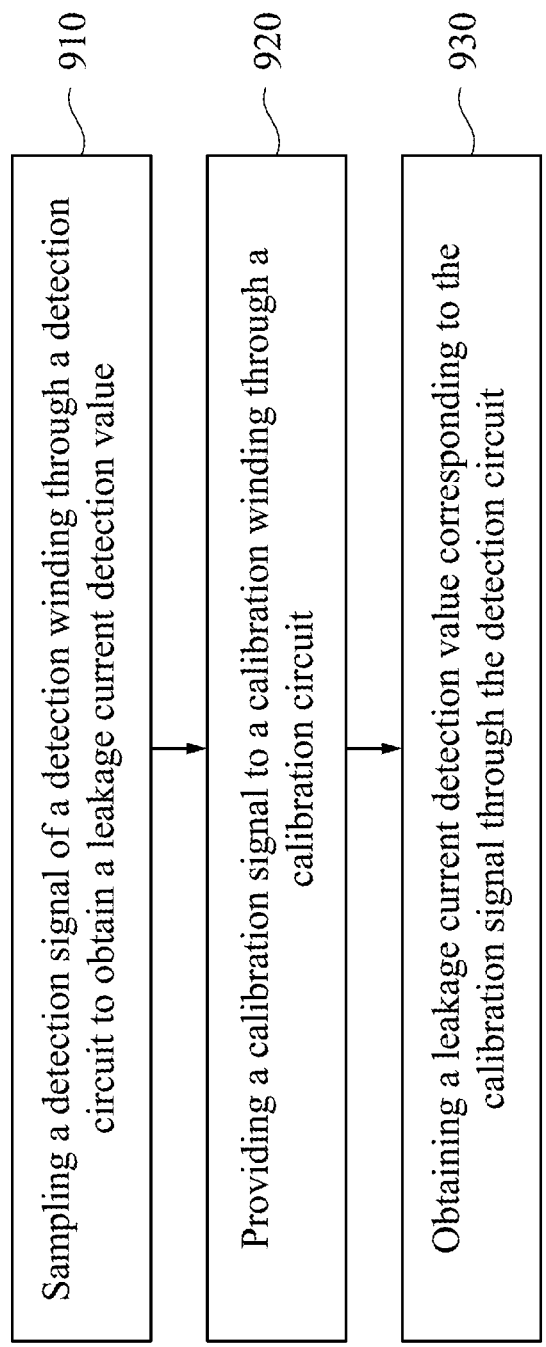

DETECTION DEVICE, INVERTER AND DETECTION METHOD

RELATED APPLICATIONS

This application claims priority to China Application Serial Number 202110805448.0, filed Jul. 16, 2021, which is herein incorporated by reference.

BACKGROUND

Field of Invention

The present disclosure relates to an electronic device and an operating method. More particularly, the present disclosure relates to a detection device, an inverter, and a detection method.

Description of Related Art

Non-isolated photovoltaic inverters generate leakage currents during operation. The existence of leakage current will cause grid current distortion, which will lead to electromagnetic interference issues and endanger equipment and personal safety. Different regions or countries have different standards for leakage current. Taking IEC62109 for example, when the continuous leakage current exceeds 300 mA, or when the leakage current jump exceeds 30 mA, 60 mA and 150 mA, the photovoltaic inverter must be disconnected and stop working within a specified time. The integrated leakage current transducer in the related art is usually expensive, and can not complete the detection of the leakage current with the amplitude value greater than 500 mA and with the frequency band higher than 3.5 kHz, and also can not perform leakage current calibration, which in turn affects the accuracy of the leakage current detection.

SUMMARY

One aspect of the present disclosure is to provide a detection device. The detection device is configured to detect a leakage current flowing through a conductor. The detection device includes a magnetic core, a detection winding and a calibration winding both wound on the magnetic core, a detection circuit, and a calibration circuit. The detection circuit is coupled to the detection winding, and configured to sample a detection signal of the detection winding to obtain a leakage current detection value. The calibration circuit is coupled to the calibration winding, and configured to provide a calibration signal to the calibration winding.

In the foregoing, the detection device further includes a drive circuit. The drive circuit is coupled to the detection winding, the detection circuit, and a DC source. The drive circuit is configured to receive the detection signal to generate an excitation signal based on the detection signal and the DC source and provide the excitation signal to the detection winding.

In the foregoing, the drive circuit and the detection circuit form a self-oscillation to generate the excitation signal so as to control the drive circuit to periodically magnetize and demagnetize the detection winding.

In the foregoing, the detection circuit further includes a sampling resistor, a differential sampler, and a low-pass filter. The sampling resistor is coupled to the detection winding. The differential sampler is coupled to the sampling resistor in parallel, and configured to sample the detection signal of the detection winding. The low-pass filter is coupled to the differential sampler and is configured to perform low-pass filtering on the detection signal so as to obtain the leakage current detection value.

In the foregoing, the drive circuit includes a hysteresis comparator, a phase inverter, and an excitation driver. The hysteresis comparator is configured to receive the detection signal, and compare the detection signal and a preset threshold value to generate a comparison result. The hysteresis comparator outputs a first control signal according to the comparison result. The phase inverter is coupled to the hysteresis comparator, and configured to invert the first control signal to generate a second control signal. A first input terminal of the excitation driver is coupled to the hysteresis comparator to receive the first control signal, a second input terminal of the excitation driver is coupled to the phase inverter to receive the second control signal, and the excitation driver generates the excitation signal based on the first control signal and the second control signal.

In the foregoing, the leakage current detection value and the leakage current satisfy a linear equation. The calibration circuit provides a first calibration signal to the calibration winding, a first leakage current detection value corresponding to the first calibration signal is obtained through the detection circuit, and a zero point of the linear equation is calibrated based on the first calibration signal and the first leakage current detection value. The calibration circuit provides a second calibration signal to the calibration winding, a second leakage current detection value corresponding to the second calibration signal is obtained through the detection circuit, and a slope of the linear equation is calibrated based on the second calibration signal and the second leakage current detection value.

Another aspect of the present disclosure is to provide an inverter. The inverter includes an AC side and the detection device. The detection device is coupled to the AC side to detect a leakage current flowing through the AC side.

In the foregoing, the AC side includes a plurality of power lines. The plurality of power lines pass through the magnetic core.

Still another aspect of the present disclosure is to provide a detection method. The detection method is applied to a detection device. The detection device includes a magnetic core, a detection winding and a calibration winding both wound on the magnetic core, a detection circuit, and a calibration circuit. The detection circuit is coupled to the detection winding. The calibration circuit is coupled to the calibration winding. The detection method includes: sampling a detection signal of the detection winding through the detection circuit to obtain a leakage current detection value; and providing a calibration signal to the calibration winding through the calibration circuit.

In the foregoing, the detection device further includes a drive circuit. One terminal of the drive circuit is coupled to the detection winding. Another terminal of the drive circuit is coupled to the detection circuit. The detection method further includes: receiving the detection signal through the drive circuit to generate an excitation signal based on the detection signal, and providing the excitation signal to the detection winding.

In the foregoing, the drive circuit and the detection circuit form a self-oscillation to generate the excitation signal so as to control the drive circuit to periodically magnetize and demagnetize the detection winding.

In the foregoing, the leakage current detection value and a leakage current satisfy a linear equation. A first calibration signal is provided to the calibration winding through the calibration circuit, a first leakage current detection value corresponding to the first calibration signal is obtained through the detection circuit, and a zero point of the linear equation is calibrated based on the first calibration signal and the first leakage current detection value. A second calibration signal is provided to the calibration winding through the calibration circuit, a second leakage current detection value corresponding to the second calibration signal is obtained through the detection circuit, and a slope of the linear equation is calibrated based on the second calibration signal and the second leakage current detection value.

Therefore, according to the technical content of the present disclosure, the detection device, inverter and detection method according to the present disclosure only need to use two types of windings, so the manufacturing is simple and the cost is low. The drive circuit and the detection circuit form the self-oscillation to periodically magnetize and demagnetize the detection winding, so no additional controller is required for control. As a result, software resources can be saved and human control errors can be avoided. The frequency of the self-oscillation can be set to increase the detection bandwidth of the detection circuit by adjusting the magnetic core and the excitation driver, so that the detection bandwidth can exceed 3.5 KHz and the measurement range of the leakage current can also exceed 500 milliamperes (mA) to avoid the inaccuracy caused by high-frequency glitch leakage current. The calibration winding with multiple turns can be used to calibrate at a larger current point. The calibration value at the larger current point can be used together with the zero-point calibration value to reduce the inherent deviation and linearity error. As a result, the sampling accuracy of the leakage current is improved. The detection circuit is less sensitive to temperature changes, so it can accurately perform detection at the normal operating temperature of the inverter.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

FIG. 9 depicts a schematic diagram of a flow of a detection method according to one embodiment of the present disclosure.

According to the usual mode of operation, various features and elements in the figures have not been drawn to scale, which are drawn to the best way to present specific features and elements related to the present disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

Figure 1:
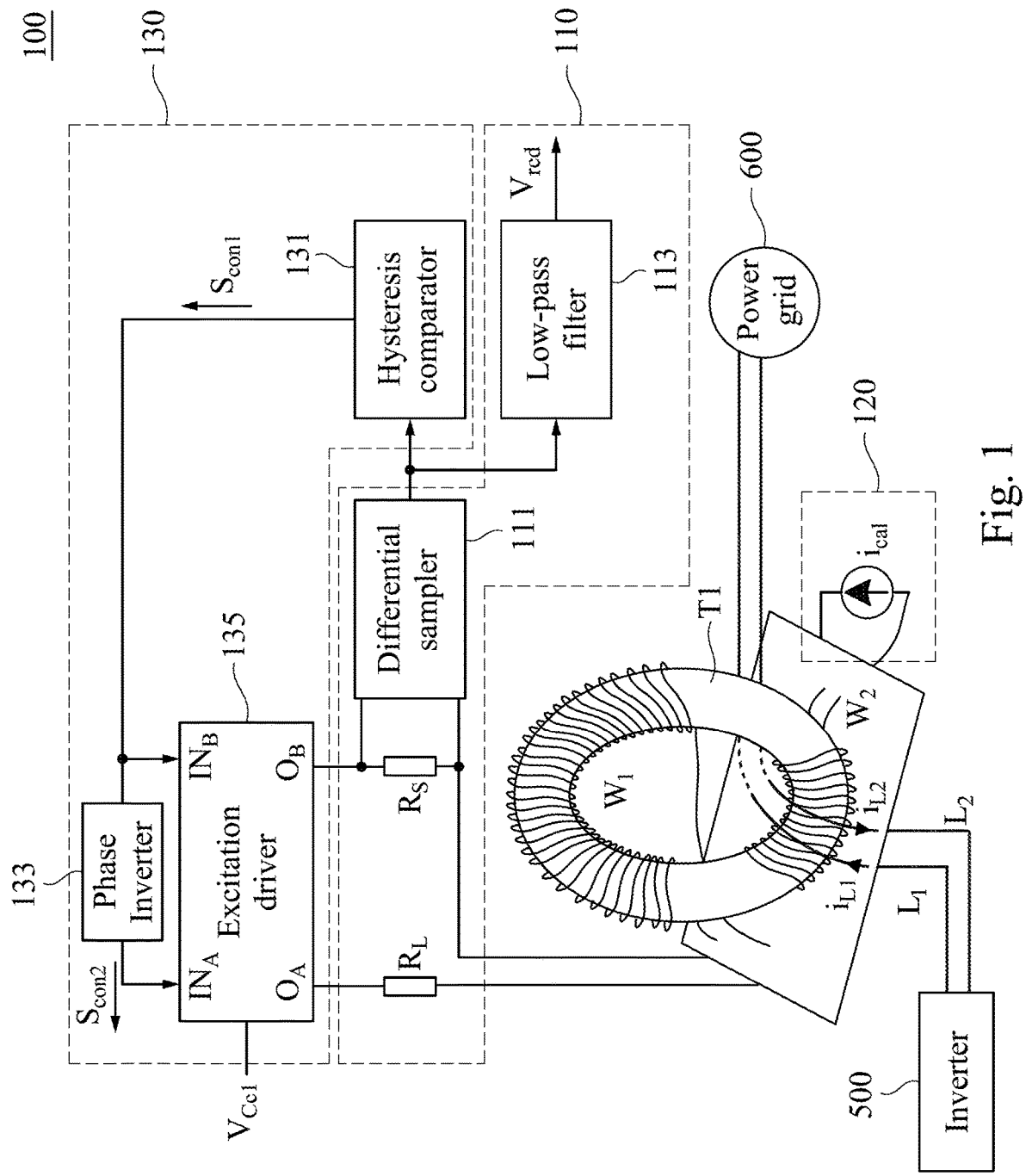
FIG. 1 depicts a schematic diagram of a detection device according to one embodiment of the present disclosure.

FIG. 1 depicts a schematic diagram of a detection device 100 according to one embodiment of the present disclosure. As shown in the figure, the detection device 100 includes a magnetic core T1, a detection winding W1 wound on the magnetic core T1, a calibration winding W2 wound on the magnetic core T1, a detection circuit 110, and a calibration circuit 120.

As for the connection relationships, the detection circuit 110 is coupled to the detection winding W1. The calibration circuit 120 is coupled to the calibration winding W2. As for the operation, the detection circuit 110 is configured to sample a detection signal of the detection winding W1 to obtain a leakage current detection value. The calibration circuit 120 is configured to provide a calibration signal to the calibration winding W2.

A description is provided with reference to FIG. 1. The leakage current detection value and the leakage current satisfy a linear equation. The calibration circuit 120 can provide a first calibration signal to the calibration winding W2. A first leakage current detection value corresponding to the first calibration signal is obtained through the detection circuit 110. A zero point of the linear equation is calibrated based on the first calibration signal and the first leakage current detection value. The first calibration signal is zero. The calibration circuit 120 can provide a second calibration signal to the calibration winding W2. A second leakage current detection value corresponding to the second calibration signal is obtained through the detection circuit 110. A slope of the linear equation is calibrated based on the second calibration signal and the second leakage current detection value. The second calibration signal may have a larger current value.

In one embodiment, the detection device 100 further includes a drive circuit 130. The drive circuit 130 is coupled to the detection winding W1, the detection circuit 110, and a direct current (DC) source $VC_{c1}$, and is configured to receive the detection signal to generate an excitation signal based on the detection signal and the DC source $VC_{c1}$, such as but not limited to a DC voltage, and provide the excitation signal to the detection winding W1.

In another embodiment, the drive circuit 130 and the detection circuit 110 form a self-oscillation to generate the excitation signal so as to control the drive circuit 130 to periodically magnetize and demagnetize the detection winding W1.

A description is provided with reference to FIG. 1. The detection circuit 110 further includes a sampling resistance $R_s$, a differential sampler 111, and a low-pass filter 113. The sampling resistor $R_s$ is coupled to the detection winding W1. The differential sampler 111 is coupled to the sampling resistor $R_s$ in parallel, and is configured to sample the detection signal of the detection winding W1. The low-pass filter 113 is coupled to the differential sampler 111 and is configured to perform low-pass filtering on the detection signal so as to obtain a leakage current detection value $V_{rcd}$.

In one embodiment, the drive circuit 130 includes a hysteresis comparator 131, a phase inverter 133, and an excitation driver 135. The hysteresis comparator 131 is coupled to the differential sampler 111 and is configured to compare the detection signal with a preset threshold value to generate a comparison result. The hysteresis comparator 131 outputs a first control signal $S_{con1}$ according to the comparison result. The phase inverter 133 is coupled to the hysteresis comparator 131, and is configured to invert the first control signal $S_{con1}$ to generate a second control signal $S_{con2}$. A first input terminal $IN_B$ of the excitation driver 135 is coupled to the hysteresis comparator 131 to receive the first control signal $S_{con1}$, and a second input terminal $IN_A$ of the excitation driver 135 is coupled to the phase inverter 133 to receive the second control signal $S_{con2}$. In addition, the excitation driver 135 generates the excitation signal based on the first control signal $S_{con1}$, the second control signal $S_{con2}$, and the DC source $V_{Cc1}$ to further provide the excitation signal to the detection winding W1 through output terminals $O_A$, $O_B$ of the excitation driver 135.

In another embodiment, the above second calibration signal should satisfy $I_c > 50\% I_{MAX}/N_2$, here $I_c$ is the second calibration signal, $I_{MAX}$ is an upper limit of the leakage current, and $N_2$ is a number of turns of the calibration winding W2.

A description is provided with reference to FIG. 1, for example, a number of turns of the detection winding W1 and a number of turns of the calibration winding W2 are $N_1$ and $N_2$, respectively. The magnetic core T1 may be but is not limited to an amorphous magnetic core with high permeability and low coercivity. The detection winding W1 and the calibration winding W2 are wound on the magnetic core T1. An output side of the excitation driver 135 is connected in series with a current limiting resistor $R_L$ and the detection resistor $R_s$ to perform periodic magnetization of the detection winding W1 in forward and reverse directions. After a current flowing through the detection resistor $R_s$ is obtained by the detection circuit 110, on the one hand it is sent to a back-end circuit, such as the hysteresis comparator 131, etc., to complete the periodic oscillation, and on the other hand the leakage current detection value is obtained after a fundamental frequency component is removed by the low-pass filter 113. The detailed working principle is described as follows.

When a photovoltaic output $i_{L1}+i_{L2}=0$, there is no leakage current in a photovoltaic inverter. Owing to the existence of the phase inverter 133, the control signal $S_{con2}$ received at the input terminal $IN_A$ and the control signal $S_{con1}$ received at the input terminal $IN_B$ are always in a complementary and inverted state. If it is assumed that a signal at the input terminal $IN_A$ is initially high and a signal at the input terminal $IN_B$ is initially low, the excitation driver 135 uses the DC source $VC_{c1}$ to positively magnetize the detection winding W1, and a current on the detection resistance $R_s$ is positively increased.

In another embodiment, the present disclosure provides an inverter 500. The inverter 500 includes an alternating current (AC) side which may connect to a power grid 600. The detection device 100 is coupled to the AC side to detect a leakage current generated by the AC side (such as the power grid 600).

In one embodiment, the AC side includes a plurality of power lines, and the plurality of power lines pass through the magnetic core T1 shown in FIG. 1.

Figure 2:
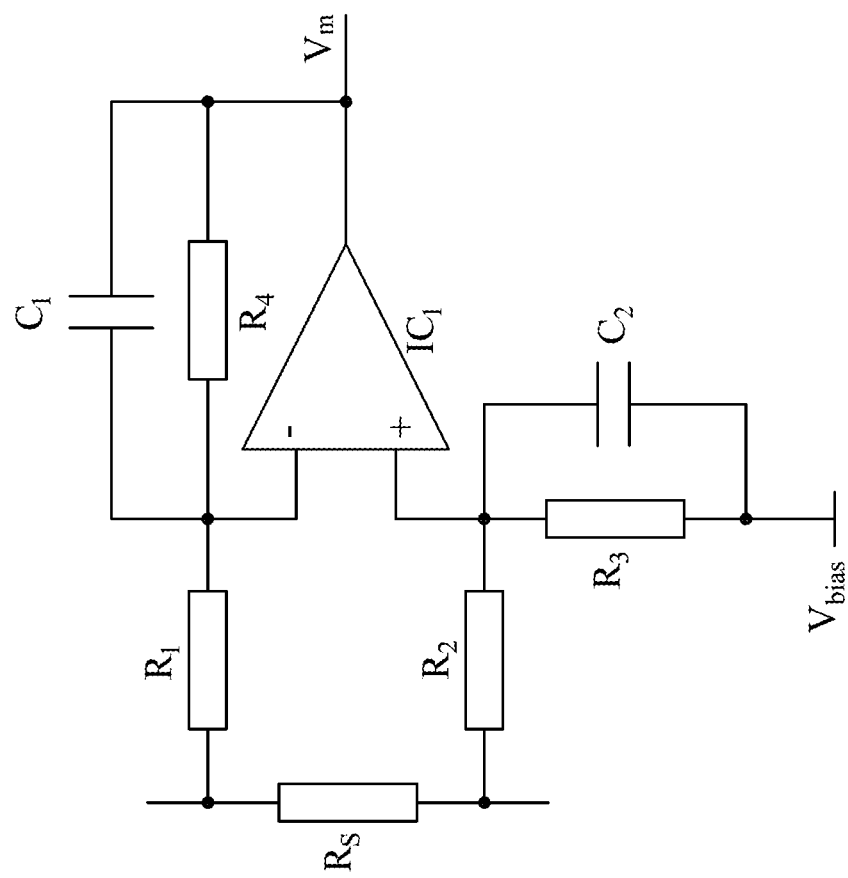
FIG. 2 depicts a detailed schematic diagram of a differential sampler of the detection device shown in FIG. 1 according to one embodiment of the present disclosure.

FIG. 2 depicts a detailed schematic diagram of the differential sampler 111 of the detection device 100 shown in FIG. 1 according to one embodiment of the present disclosure. As shown in the figure, a gain of the differential sampler 111 is $G_1$, and the detection signal on the detection resistor $R_s$ is, for example, a voltage signal that is reversely linearly amplified and is offset by a bias voltage $V_{bias}$. In greater detail, one terminal of the detection resistor $R_s$ is connected to one terminal of a resistor $R_1$, another terminal of the detection resistor $R_s$ is connected to one terminal of a resistor $R_2$, another terminal of the resistor $R_1$ is connected to an inverting terminal of an operational amplifier (op amp) $IC_1$, and another terminal of the resistor $R_2$ is connected to a non-inverting terminal of the op amp $IC_1$. A resistor R4 and a capacitor C1 are connected in parallel and then connected between the inverting terminal and an output terminal of the op amp $IC_1$. A resistor R3 and a capacitor C2 are connected in parallel to form a branch. One terminal of the branch is connected to the non-inverting terminal of the op amp $IC_1$, and another terminal of the branch receives the bias voltage $V_{bias}$.

Figure 3:
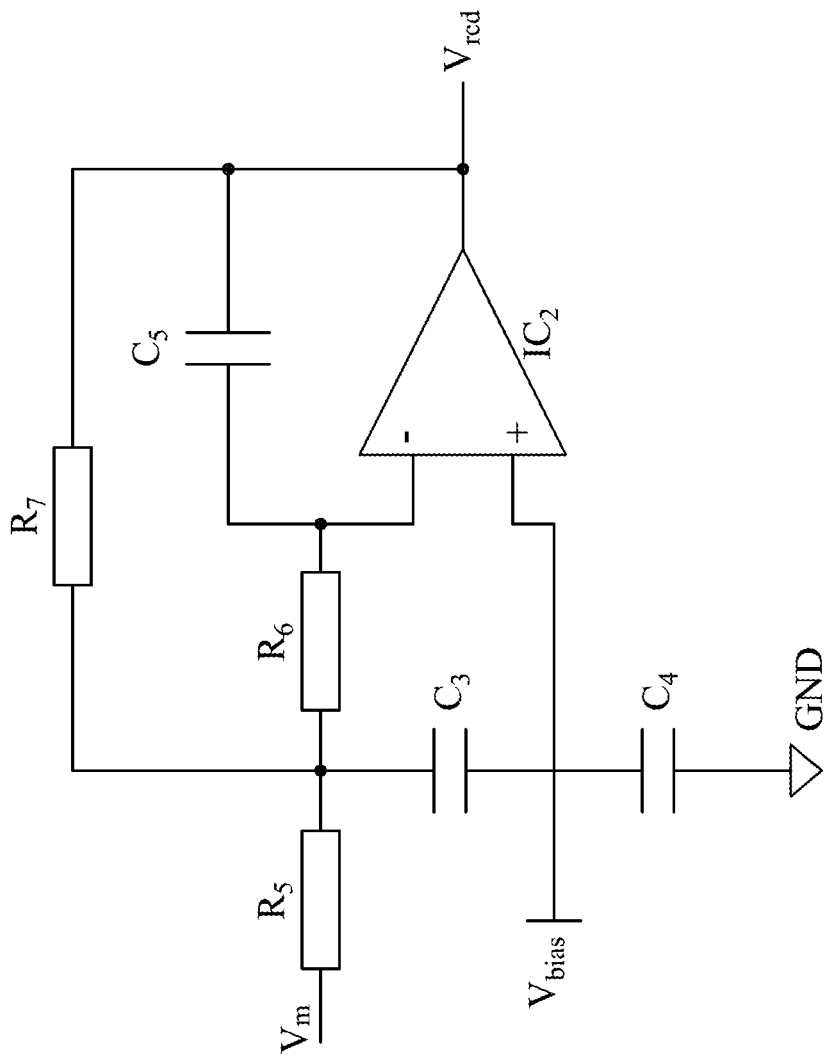
FIG. 3 depicts a detailed schematic diagram of a low-pass filter of the detection device shown in FIG. 1 according to one embodiment of the present disclosure.

FIG. 3 depicts a detailed schematic diagram of the low-pass filter 113 of the detection device 100 shown in FIG. 1 according to one embodiment of the present disclosure. As shown in the figure, the low-pass filter 113 may be but is not limited to a second-order low-pass filter. An output voltage $V_m$ obtained by the differential sampler 111 is provided to the low-pass filter 113. A cut-off frequency $f_c$ of the low-pass filter 113 is set to be smaller than oscillation frequency $f_s$ and a gain of the low-pass filter 113 is set to be G2, then a final leakage current detection value $V_{rod}$ can be obtained. The leakage current detection value $V_{rod}$ can be directly sent to a digital controller or some other unit for processing. A magnitude of the actual leakage current can be calculated according to the following formula 1 to directly measure the leakage current:

$$i_{rcd} = \frac{N_1 V_{rcd}}{G_1 G_2 R_s} \quad (1)$$

Figure 4:
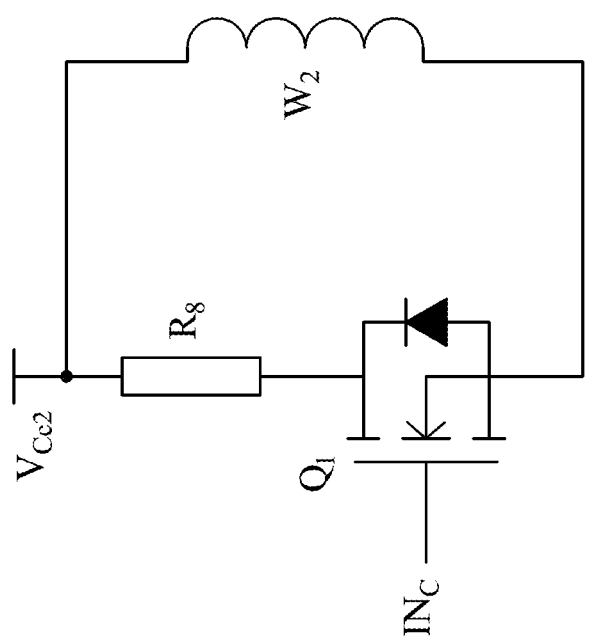
FIG. 4 depicts a detailed schematic diagram of a calibration circuit of the detection device shown in FIG. 1 according to one embodiment of the present disclosure.

FIG. 4 depicts a detailed schematic diagram of the calibration circuit 120 of the detection device 100 shown in FIG. 1 according to one embodiment of the present disclosure. FIG. 4 depicts a schematic diagram of a connection of the calibration circuit 120 and the calibration winding W2. Before the actual application of the detection device 100, a self-test and a calibration are required to ensure reliability and accuracy, which can be completed by the calibration circuit 120 in cooperation with the overall testing. A description is provided with reference to FIG. 1 to FIG. 4, a current source $i_{cal}$ of the calibration circuit 120 and two terminals of the calibration winding W2 are connected in series. W2 An implementation example of the current source $i_{cal}$, is shown in FIG. 4, which is composed of a switch Q1 and a resistor R8. The resistor R8 may be a surface mounted resistor. When performing the self-test, the switch Q1 is controlled to be turned on through a signal $IN_C$, thus providing the calibration winding W2 with the calibration signal, such as an excitation current signal with the value $VC_{c2}/R_8$. The leakage current detection value $V_{rcd}$ is obtained through the detection circuit 100, and then whether the leakage current can satisfy the relationship in formula 1 is determined through calculation. If it satisfies the relationship within an error range, a controller (not shown in the figure) can record the value $V_{rcd}$ at this time as a calibration value.

After the self-test is completed, the switch Q1 is turned off. At this time, the first calibration signal provided by the calibration circuit 120 is zero. The detection circuit 110 samples the detection signal on the detection winding W1 and the low-pass filter 113 outputs the leakage current detection value $V_{rcd}$ The $V_{rcd}$ at this time is used as a calibration value at zero leakage current for calibrating the zero point of the linear equation, which can calibrate the inherent DC deviation of the system.

Figure 5:
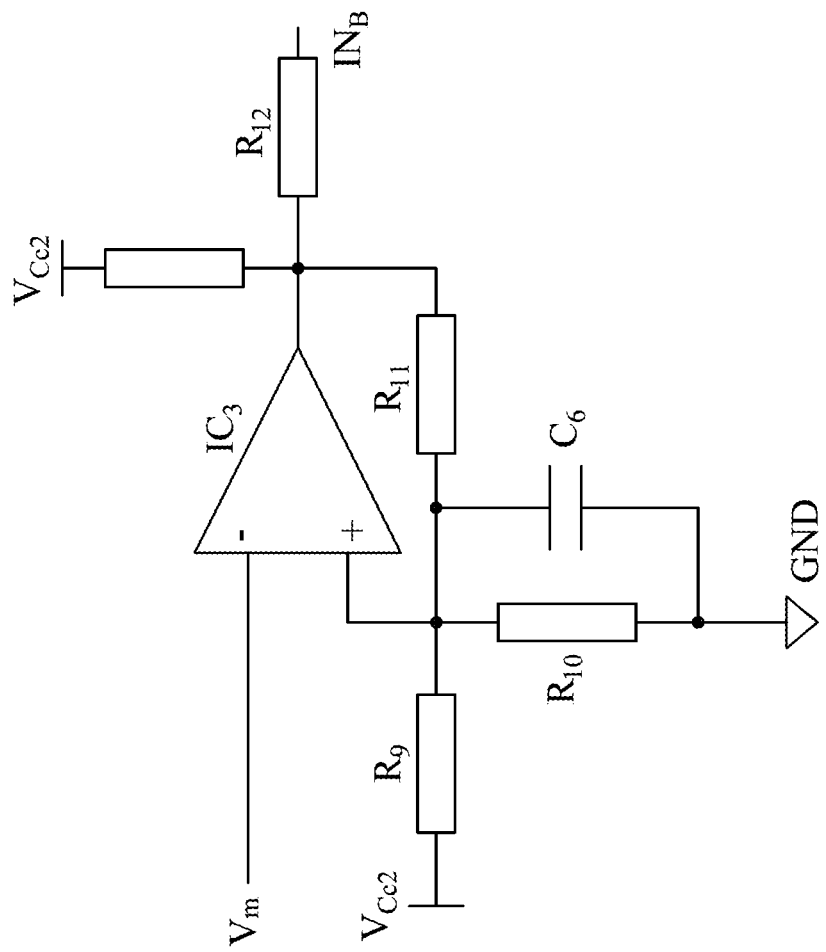
FIG. 5 depicts a detailed schematic diagram of a hysteresis comparator of the detection device shown in FIG. 1 according to one embodiment of the present disclosure.
Figure 6:
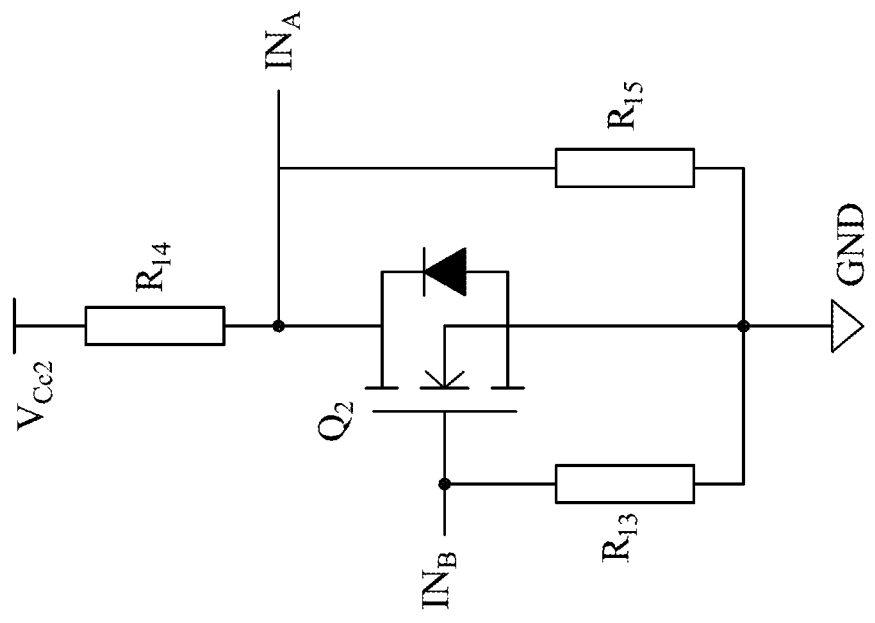
FIG. 6 depicts a detailed schematic diagram of a phase inverter of the detection device shown in FIG. 1 according to one embodiment of the present disclosure.
Figure 7:
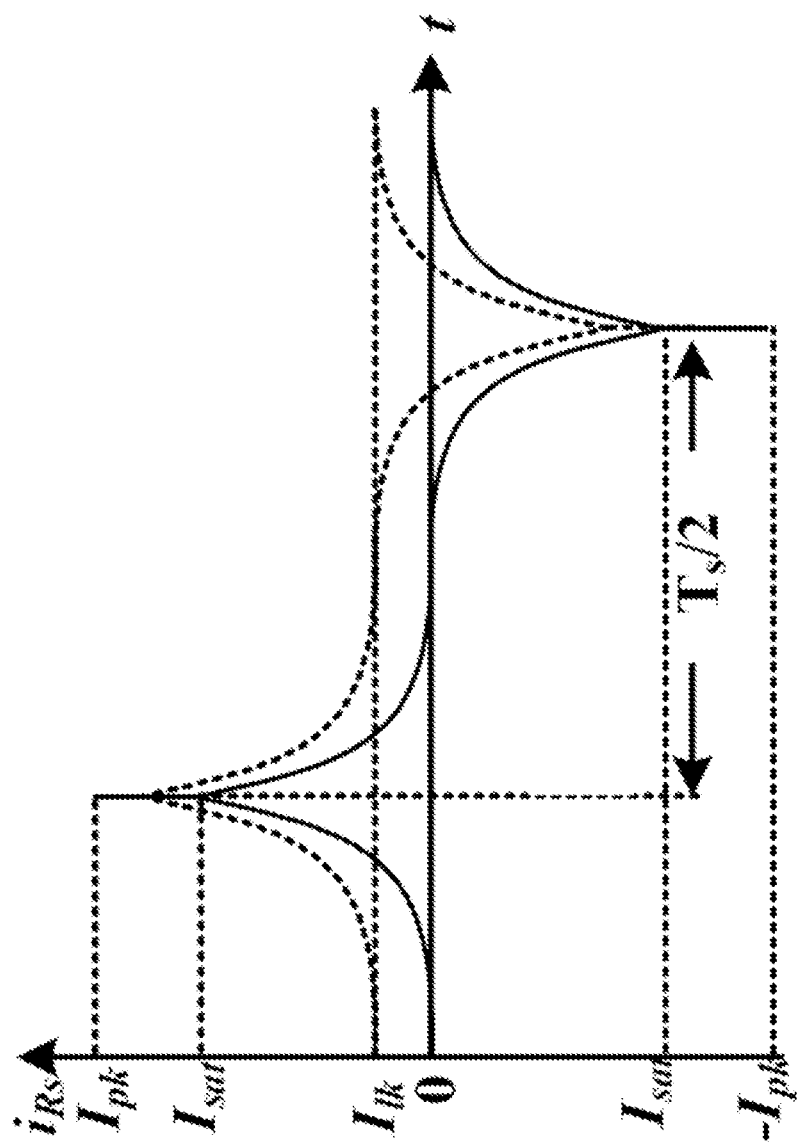
FIG. 7 depicts a schematic diagram of current waveforms when the detection device shown in FIG. 1 is at different leakage currents according to one embodiment of the present disclosure.

FIG. 5 depicts a detailed schematic diagram of the hysteresis comparator 131 of the detection device 100 shown in FIG. 1 according to one embodiment of the present disclosure. FIG. 6 depicts a detailed schematic diagram of the phase inverter 133 of the detection device 100 shown in FIG. 1 according to one embodiment of the present disclosure. The hysteresis comparator 131 sets upper limit $V_H$ and lower limit $V_L$. When a current of the detection resistor $R_s$ increases to exceed a limit value corresponding to $V_L$, the hysteresis comparator 131 flips and the signal at the input terminal $IN_B$ becomes high. The phase inverter 133 of FIG. 6 can keep the signal at the input terminal $IN_A$ and the signal at the input terminal $IN_B$ to be always inverted, so the signal at the input terminal $IN_A$ becomes low. After that, the excitation driver 135 will reversely magnetize the detection winding W1, and the current through the detection resistance $R_s$ will increase in the reverse direction until a flip again to form a periodic symmetrical oscillation. FIG. 7 depicts current waveforms through the detection winding W1 at different leakage currents. The solid line is the current waveform through the detection resistor $R_s$ when the leakage current is zero. If the positive and negative magnetization curves of the magnetic core T1 are completely symmetrical, the magnetization current of the detection winding W1 is symmetrical, and $(V_H+V_L)/2=V_{bias}$, upper and lower limits of the hysteresis comparator 131 will correspond to a current limit value $I_{pk}$ of the detection winding W1.

When a DC leakage current with a magnitude $I_{lk}$ passes the magnetic core T1, the magnetization curve of the magnetic core T1 will shift entirely, and the current of the detection winding W1 is also offset with the magnitude of the leakage current $I_{lk}$, as shown by the dashed current in FIG. 7. The number of turns $N_1$ must be great enough to ensure that when the leakage current $I_{lk}$ changes within the measurement range, $I_{lk}/N_1+I_{sat}$ always does not exceed the limit value $I_{pk}$. At the same time, a duty ratio of the excitation drive is ensured to be always 0.5, or the measurement accuracy is affected. Additionally, if the number of turns $N_1$ is too small, it will cause the excessively large excitation current to affect the measurement accuracy. Take 1% of the excitation current as the design target, and ensure that the following formula is satisfied:

$$\frac{V_{Cc2\_eq}}{2\pi f_m A_L N_1^2} < 1\% \, I_{lk} \qquad (2)$$

Here, $VCc_{2\_eq}$ is an equivalent input voltage at a positive terminal of the hysteresis comparator 131, fm is an excitation frequency of the excitation driver 135, and $A_L$ is an inductance coefficient of the magnetic core T1.

When the leakage current has a high frequency component, it will similarly cause an alternating offset correspondingly. According to the electromagnetic formula, it can be known that $VC_{c1}=N_1 A_e * dB/dt$ when magnetizing the detection winding W1. If a saturation magnetic density of the magnetic core T1 is $B_m$, the oscillation frequency can be obtained as:

$$f_s = V_{Cc1}/(4 B_m A_e N_1) \qquad (3)$$

Here, Ae is a cross-sectional area of the magnetic core T1.

The current through the detection winding W1 include both an original excitation component with a fundamental frequency equal to $f_s$ and a leakage current component $I_{lk}/N_1$.

Figure 8:
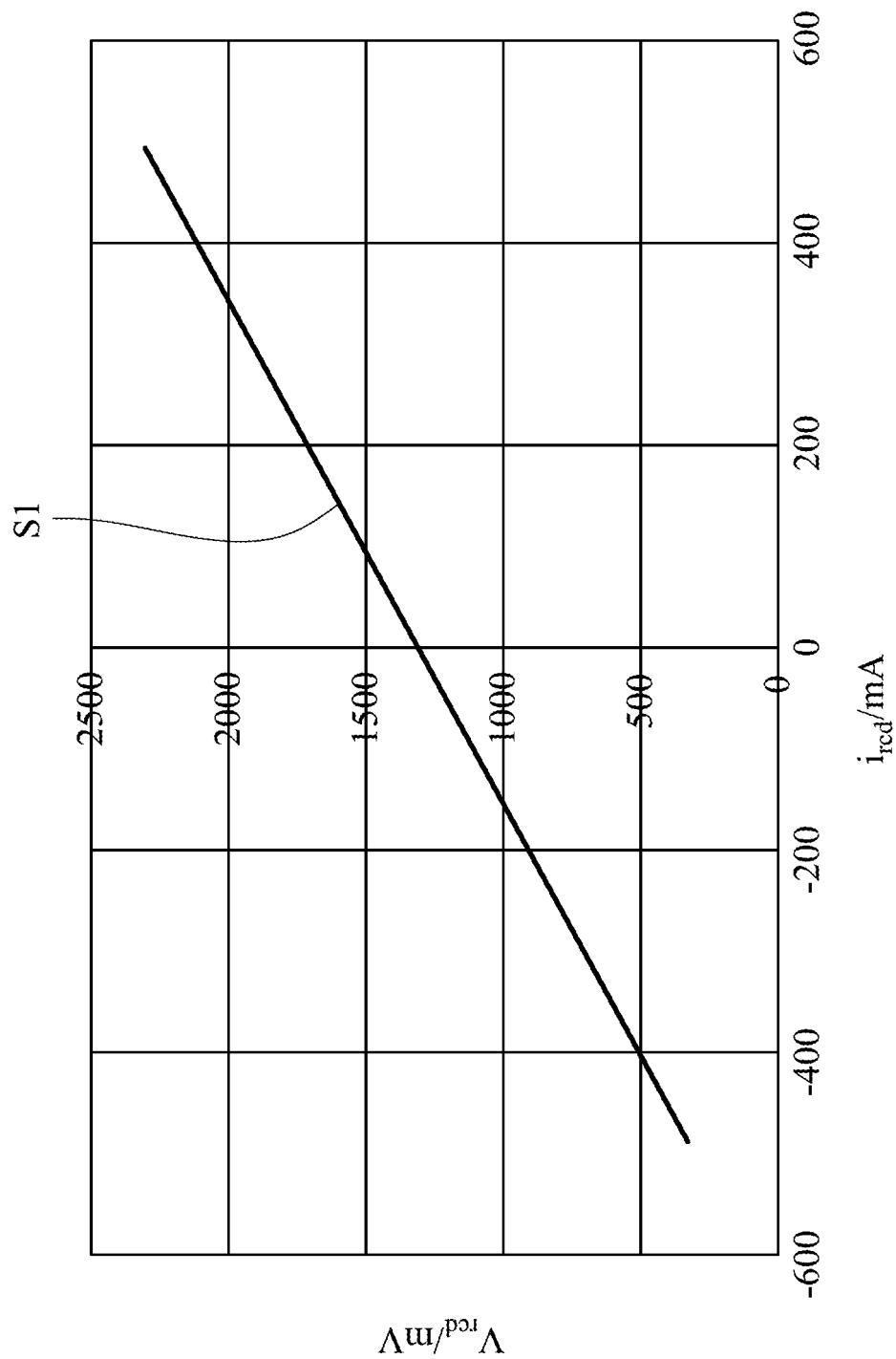
FIG. 8 depicts a comparison diagram of a current detection value of the detection device shown in FIG. 1 and a leakage current according to one embodiment of the present disclosure.

FIG. 8 depicts a comparison diagram of a current detection value of the detection device 100 shown in FIG. 1 and the leakage current according to one embodiment of the present disclosure. FIG. 8 shows a straight line S1 representing the relationship between the leakage current detection value and the leakage current of the system. The leakage current detection value and the leakage current satisfy the linear equation: y=a*x+b. When the calibration signal is close to the zero point, the detection linearity is reduced, and calibration is not very meaningful. Through a multi-winding design of the calibration winding W2, $N_2 I_{cal}$>50% $I_{lk}$ is ensured, which can simulate the excitation when the leakage current is larger correspondingly and obtain the leakage current detection value $V_{rcd}$ at a large current. In this manner, the "b" in the linear equation can be calibrated when the calibration signal is zero, and the "a" in the linear equation can be calibrated when the calibration signal is a large current. Finally, a more accurate linear expression can be obtained, which effectively reduces the inherent DC deviation and linearity error of the detection circuit to improve the sampling accuracy of the leakage current.

FIG. 9 depicts a schematic diagram of a flow of a detection method 900 according to one embodiment of the present disclosure. The detection method 900 includes the following steps: (step 910) sampling a detection signal of a detection winding through a detection circuit to obtain a leakage current detection value; (step 920) providing a calibration signal to a calibration winding through a calibration circuit; (step 930) obtaining a leakage current detection value corresponding to the calibration signal through the detection circuit.

In order to facilitate the understanding of the detection method 900 of the present disclosure, a description is provided with reference to FIG. 1 and FIG. 9. In step 910, the detection circuit 110 can be used to sample the detection signal of the detection winding W1 to obtain the leakage current detection value. In step 920, the calibration circuit 120 can be used to provide the calibration signal to the calibration winding W2.

In step 930, the detection circuit 110 can be used to obtain the leakage current detection value corresponding to the calibration signal. Step 920 and step 930 can be described in greater detail. The calibration circuit 120 can be used to provide a first calibration signal and a second calibration signal to the calibration winding W2. The detection circuit 110 is used to obtain a first leakage current detection value corresponding to the first calibration signal and a second leakage current detection value corresponding to the second calibration signal. The leakage current detection value and a leakage current satisfy a linear equation. A zero point of the linear equation is calibrated based on the first calibration signal and the first leakage current detection value, and a slope of the linear equation is calibrated based on the second calibration signal and the second leakage current detection value.

In one embodiment, the detection method 900 includes receiving the detection signal through the drive circuit 130, generating an excitation signal based on the detection signal, and providing the excitation signal to the detection winding W1.

In another embodiment, the detection method 900 includes generating the excitation signal through a self-oscillation formed by the drive circuit 130 and the detection circuit 110 to control the drive circuit 130 to periodically magnetize and demagnetize the detection winding W1.

In one embodiment, parameters used by the detection method 900 satisfy the following criterion. The second calibration signal should satisfy $I_c > 50\% \, I_{MAX}/N_2$, here $I_c$ is the second calibration signal, $I_{MAX}$ is an upper limit value of the leakage current, and $N_2$ is a number of turns of the calibration winding W2.

It is thus understood from the embodiments of the present disclosure that application of the present disclosure has the following advantages. The detection device, inverter, and detection method according to the present disclosure only need to use two types of windings, so the manufacturing is simple and the cost is low. The drive circuit and the detection circuit form the self-oscillation to periodically magnetize and demagnetize the detection winding, so no additional controller is required for control. As a result, software resources can be saved and human control errors can be avoided. The frequency of the self-oscillation can be set to increase the detection bandwidth of the detection circuit by adjusting the magnetic core and the excitation driver, so that the detection bandwidth can exceed 3.5 KHz and the measurement range can also exceed 500 milliamperes (mA) to avoid the inaccuracy caused by high-frequency glitch leakage current. The calibration winding with multiple turns can be used to calibrate at a larger current point. The calibration value at the larger current point can be used together with the zero-point calibration value to reduce the inherent deviation and linearity error. The detection circuit is less sensitive to temperature changes, so it can accurately perform detection at the normal operating temperature of the inverter.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A detection device configured to detect a leakage current flowing through a conductor, the detection device comprising:
    a magnetic core;
    a detection winding and a calibration winding both wound on the magnetic core;
    a detection circuit, coupled to the detection winding, and configured to sample a detection signal of the detection winding to obtain a leakage current detection value;
    a calibration circuit, coupled to the calibration winding, and configured to provide a calibration signal to the calibration winding; and
    a drive circuit, electrically connecting to the detection winding, wherein the drive circuit is electrically connected to the detection circuit and a DC source, wherein the drive circuit is configured to receive the detection signal to generate an excitation signal based on the detection signal and the DC source, and provide the excitation signal to the detection winding.

2. The detection device of claim 1, wherein the drive circuit and the detection circuit form a self-oscillation to generate the excitation signal so as to control the drive circuit to periodically magnetize and demagnetize the detection winding.

3. The detection device of claim 2, wherein the drive circuit comprises:
    a hysteresis comparator, configured to receive the detection signal, and compare the detection signal and a preset threshold value to generate a comparison result, wherein the hysteresis comparator outputs a first control signal according to the comparison result;
    a phase inverter coupled to the hysteresis comparator, and configured to invert the first control signal to generate a second control signal; and
    an excitation driver, wherein a first input terminal of the excitation driver is coupled to the hysteresis comparator to receive the first control signal, a second input terminal of the excitation driver is coupled to the phase inverter to receive the second control signal, and the excitation driver generates the excitation signal based on the first control signal and the second control signal.

4. The detection device of claim 1, wherein the detection circuit comprises:
    a sampling resistor, coupled to the detection winding;
    a differential sampler, coupled to the sampling resistor in parallel, and configured to sample the detection signal of the detection winding; and
    a low-pass filter, coupled to the differential sampler, and configured to perform low-pass filtering on the detection signal so as to obtain the leakage current detection value.

5. The detection device of claim 1, wherein the drive circuit comprises:
    a hysteresis comparator, configured to receive the detection signal, and compare the detection signal and a preset threshold value to generate a comparison result, wherein the hysteresis comparator outputs a first control signal according to the comparison result;
    a phase inverter, coupled to the hysteresis comparator, and configured to invert the first control signal to generate a second control signal; and an excitation driver, wherein a first input terminal of the excitation driver is coupled to the hysteresis comparator to receive the first control signal, a second input terminal of the excitation driver is coupled to the phase inverter to receive the second control signal, and the excitation driver generates the excitation signal based on the first control signal and the second control signal.

6. The detection device of claim 1, wherein the leakage current detection value and the leakage current satisfy a linear equation;
   wherein the calibration circuit provides a first calibration signal to the calibration winding, a first leakage current detection value corresponding to the first calibration signal is obtained through the detection circuit, and a zero point of the linear equation is calibrated based on the first calibration signal and the first leakage current detection value; and
   wherein the calibration circuit provides a second calibration signal to the calibration winding, a second leakage current detection value corresponding to the second calibration signal is obtained through the detection circuit, and a slope of the linear equation is calibrated based on the second calibration signal and the second leakage current detection value.

7. An inverter, comprising:
   an AC side; and
   the detection device of claim 1;
   wherein the detection device is coupled to the AC side to detect a leakage current flowing through the AC side.

8. The inverter of claim 7, wherein the AC side comprises a plurality of power lines, and the plurality of power lines pass through the magnetic core.

9. A detection method applied to a detection device, the detection device comprising a magnetic core, a detection winding and a calibration winding both wound on the magnetic core, a detection circuit, a calibration circuit, and a drive circuit, wherein the detection circuit is coupled to the detection winding, and the calibration circuit is coupled to the calibration winding, wherein one terminal of the drive circuit is electrically connected to the detection winding, and another terminal of the drive circuit is electrically connected to the detection circuit, wherein the detection method comprises:
   sampling a detection signal of the detection winding through the detection circuit to obtain a leakage current detection value;
   providing a calibration signal to the calibration winding through the calibration circuit; and
   receiving the detection signal through the drive circuit to generate an excitation signal based on the detection signal, and providing the excitation signal to the detection winding.

10. The detection method of claim 9, wherein the drive circuit and the detection circuit form a self-oscillation to generate the excitation signal so as to control the drive circuit to periodically magnetize and demagnetize the detection winding.

11. The detection method of claim 9, wherein the leakage current detection value and a leakage current satisfy a linear equation;
   wherein a first calibration signal is provided to the calibration winding through the calibration circuit, a first leakage current detection value corresponding to the first calibration signal is obtained through the detection circuit, and a zero point of the linear equation is calibrated based on the first calibration signal and the first leakage current detection value; and
   a second calibration signal is provided to the calibration winding through the calibration circuit, a second leakage current detection value corresponding to the second calibration signal is obtained through the detection circuit, and a slope of the linear equation is calibrated based on the second calibration signal and the second leakage current detection value.

* * * * *